United States Patent
Chabach et al.

(10) Patent No.: US 11,565,739 B2
(45) Date of Patent: Jan. 31, 2023

(54) SELF-STANDING SANDWICH STRUCTURE INCLUDING AT LEAST ONE CAPACITIVE SENSOR MEMBER AND/OR AT LEAST ONE HEATER MEMBER FOR AUTOMOTIVE VEHICLE APPLICATIONS

(71) Applicant: IEE INTERNATIONAL ELECTRONICS & ENGINEERING S.A., Echternach (LU)

(72) Inventors: Driss Chabach, Noertrange (LU); Cedric Amorosi, Gorcy (FR); Alain Schumacher, Igel (DE); Julie Distel, Boust (FR); Raphaël Bennes, Haute Kontz (FR)

(73) Assignee: IEE INTERNATIONAL ELECTRONICS & ENGINEERING S.A., Echternach (LU)

( * ) Notice: Subject to any disclaimer, the term of this patent is extended or adjusted under 35 U.S.C. 154(b) by 331 days.

(21) Appl. No.: 16/766,990

(22) PCT Filed: Nov. 27, 2018

(86) PCT No.: PCT/EP2018/082684
§ 371 (c)(1),
(2) Date: May 26, 2020

(87) PCT Pub. No.: WO2019/105923
PCT Pub. Date: Jun. 6, 2019

(65) Prior Publication Data
US 2020/0369312 A1 Nov. 26, 2020

(30) Foreign Application Priority Data
Nov. 29, 2017 (LU) .................................. LU100529
Mar. 27, 2018 (LU) .................................. LU100744

(51) Int. Cl.
*G01R 27/26* (2006.01)
*B62D 1/06* (2006.01)
(Continued)

(52) U.S. Cl.
CPC ............. *B62D 1/065* (2013.01); *B62D 1/046* (2013.01); *B60R 21/01532* (2014.10); *H03K 17/9622* (2013.01); *H05B 1/0236* (2013.01)

(58) Field of Classification Search
USPC ........................................ 324/658, 660–663
See application file for complete search history.

(56) References Cited

U.S. PATENT DOCUMENTS

| 4,535,221 A | 8/1985 | Holsworth |
| 7,019,623 B2 | 3/2006 | Klausner et al. |

(Continued)

FOREIGN PATENT DOCUMENTS

| CN | 203651539 U | 6/2014 |
| EP | 1292485 A1 | 3/2003 |

(Continued)

OTHER PUBLICATIONS

English translation of Chinese Examination Report corresponding to Chinese Application No. 201880076578.1, dated Mar. 15, 2022, 9 pages.

(Continued)

*Primary Examiner* — Vincent Q Nguyen
(74) *Attorney, Agent, or Firm* — Reising Ethington P.C.

(57) ABSTRACT

A self-standing sandwich structure includes at least one capacitive sensor member and/or at least one heater member for automotive vehicle application. The self-standing sandwich structure includes an upper protective layer that is attached, for manufacturing and storage purposes, to a carrier film member of sufficiently low surface energy for enabling separating the carrier film member and the upper (Continued)

protective layer in a non-destructive manner, a lower protective layer, a bottom adhesive layer that is attached to the lower protective layer, and at least an upper electrically conductive layer arranged between the upper protective layer and the lower protective layer.

14 Claims, 4 Drawing Sheets

(51) Int. Cl.
*B62D 1/04* (2006.01)
*B60R 21/015* (2006.01)
*H03K 17/96* (2006.01)
*H05B 1/02* (2006.01)

(56) References Cited

U.S. PATENT DOCUMENTS

| | | |
|---|---|---|
| 8,548,667 B2 | 10/2013 | Kaufmann et al. |
| 2004/0169028 A1 | 9/2004 | Hadzizukic et al. |
| 2005/0269018 A1 | 12/2005 | Haart et al. |
| 2010/0213189 A1 | 8/2010 | Keite-Telgenbuescher et al. |
| 2011/0056930 A1 | 3/2011 | Letzas et al. |
| 2011/0233183 A1 | 9/2011 | Saunders et al. |
| 2014/0246415 A1 | 9/2014 | Wittkowski |
| 2015/0367875 A1 | 12/2015 | Nonoyama et al. |
| 2017/0094398 A1* | 3/2017 | Cousins ............... H04R 1/1041 |
| 2017/0254675 A1 | 9/2017 | Hein et al. |
| 2017/0350686 A1* | 12/2017 | Otaka ................... G06F 3/0446 |
| 2017/0355391 A1 | 12/2017 | Wittkowski et al. |
| 2018/0124875 A1 | 5/2018 | Boulbitch et al. |

FOREIGN PATENT DOCUMENTS

| | | |
|---|---|---|
| EP | 2293647 A2 | 3/2011 |
| EP | 2604487 A1 | 6/2013 |
| WO | WO2004067355 A1 | 8/2004 |
| WO | WO2010028155 A2 | 3/2010 |
| WO | WO2013050621 A2 | 4/2013 |
| WO | WO2016096815 A1 | 6/2016 |
| WO | WO2016156617 A1 | 10/2016 |

OTHER PUBLICATIONS

International Search Report corresponding to International Application No. PCT/EP2018/082684, dated Feb. 12, 2019, 4 pages.
Written Opinion corresponding to International Application No. PCT/EP2018/082684, dated Feb. 12, 2019, 5 pages.
J. R. Smith et al., "Electric Field Sensing for Graphical Interfaces", published in IEEE Comput. Graph. Appl., 18(3), pp. 54-60, 1998.

* cited by examiner

SELF-STANDING SANDWICH STRUCTURE INCLUDING AT LEAST ONE CAPACITIVE SENSOR MEMBER AND/OR AT LEAST ONE HEATER MEMBER FOR AUTOMOTIVE VEHICLE APPLICATIONS

TECHNICAL FIELD

The invention relates to a self-standing sandwich structure that includes at least one capacitive sensor member and/or at least one heater member for automotive vehicle application, a vehicle steering wheel that comprises at least one such self-standing sandwich structure, and a method of applying at least one such self-standing sandwich structure to a part of a vehicle.

BACKGROUND

In the field of automotive vehicle sensor application it is known to employ sensors of various types for providing input to Automatic Driver Assistance Systems (ADAS), for instance for the purpose of a seat belt reminder (SBR) system or an activation control for an auxiliary restraint system (ARS). Sensed signals can serve as a basis for making decisions by an ADAS, for instance for a decision to deploy an air bag system to a specific vehicle seat or not.

Another example for the use of sensors in an automotive vehicle application is the so-called Hands on Detection (HoD), in which one or more sensors provide information about whether a driver has his hands on a steering wheel of a vehicle or not. This information can be transferred to an ADAS such as an Adaptive Cruise Control (ACC), which, based on the provided sensor signal, can alert the driver and remind him or her to take control of the steering wheel again. In particular, such HoD systems can be used in support to fulfill a requirement of the Vienna convention that the driver must remain in control of the vehicle at all times. HoD systems may as well be employed in a parking assistance system or an ADAS that is configured for evaluating a driver activity at high speed.

One type of sensors employed in HoD devices and systems is a torque sensor.

By way of example, application EP 2 604 487 B1 describes a control system to determine a hands on wheel (HOW) condition of a hand wheel, which is employable for a lane monitoring system. The control system includes a torque sensor that monitors an amount of applied torque exerted upon the hand wheel, and a control module for monitoring the sensor. The control module includes a notch filter to attenuate a normal column mode frequency from the amount of applied torque to produce a filtered torque signal, wherein the normal column mode frequency is configured to represent a range of vibrational modes of the hand wheel based on a hands off wheel condition. The control module further comprises a state detector to receive the filtered torque signal from the notch filter. The state detector is configured to determine if the HOW condition exists based on if the filtered torque signal exceeds an ON threshold torque value.

A widely-used type of sensor for HoD devices and other applications in the automotive sector is the capacitive sensor. In many cases, capacitive sensors are combined with heating devices, particularly in vehicle seats or in vehicle steering wheels.

A capacitive sensor or capacitive sensing device, called by some electric field sensor or proximity sensor, designates a sensor, which generates a signal responsive to the influence of what is being sensed (a person, a part of a person's body, a pet, an object, etc.) upon an electric field. A capacitive sensor generally comprises at least one antenna electrode, to which is applied an oscillating electric signal and which thereupon emits an electric field into a region of space proximate to the antenna electrode, while the sensor is operating. The sensor comprises at least one sense electrode at which the influence of an object or living being on the electric field is detected. In some (so-called "loading mode") capacitive sensors, the one or more antenna electrodes serve at the same time as sense electrodes. In this case, the measurement circuit determines the current flowing into the one or more antenna electrodes in response to an oscillating voltage being applied to them. The relationship of voltage to current yields the complex impedance between the one or more antenna electrodes and ground. In an alternative version of capacitive sensors ("coupling mode" capacitive sensors), the transmitting antenna electrode(s) and the sense electrode(s) are separate from one another. In this case, the measurement circuit determines the current or voltage that is induced in the sense electrode when the transmitting antenna electrode is operating.

The different capacitive sensing mechanisms are explained in the technical paper entitled "*Electric Field Sensing for Graphical Interfaces*" by J. R. Smith et al., published in IEEE Comput. Graph. Appl., 18(3):54-60, 1998. The paper describes the concept of electric field sensing as used for making non-contact three-dimensional position measurements, and more particularly for sensing the position of a human hand for purposes of providing three-dimensional positional inputs to a computer. Within the general concept of capacitive sensing, the author distinguishes between distinct mechanisms he refers to as "loading mode", "shunt mode", and "transmit mode" which correspond to various possible electric current pathways. In the "loading mode", an oscillating voltage signal is applied to a transmit electrode, which builds up an oscillating electric field to ground. The object to be sensed modifies the capacitance between the transmit electrode and ground. In the "shunt mode", an oscillating voltage signal is applied to the transmit electrode, building up an electric field to a receive electrode, and the displacement current induced at the receive electrode is measured, whereby the displacement current may be modified by the body being sensed. In the "transmit mode", the transmit electrode is put in contact with the user's body, which then becomes a transmitter relative to a receiver, either by direct electrical connection or via capacitive coupling. "Shunt mode" is alternatively referred to as the above-mentioned "coupling mode".

For instance, international application WO 2013/050621 A2 describes electrically conductive textiles for occupant sensing and/or heating applications, wherein the sensor and/or heater can be attached from the backside to a surface such as a driver seat, a passenger seat, a backseat, a steering wheel, a door side of compartment, a gear shift lever, etc.

A flexible heater and/or electrode comprises a woven textile material having a warp direction and a weft direction. The textile material comprises at least one region having a low electrical conductance and at least two regions having a high electrical conductance. The at least two regions of high electrical conductance are adjacent to the at least one region of low electrical conductance. At least one of the at least two regions of high electrical conductance is operatively connected to a connection terminal of the heater and/or electrode, wherein the connection terminal serves for connecting the heater and/or electrode to an electronic control circuit.

The geometry of a conventional steering wheel places higher demands on a capacitive sensor design and an "unnoticeable" installation at the steering wheel than an even surface.

As a solution, international application WO 2016/096815 A1 proposes a planar flexible carrier for use in steering wheel heating and/or sensing. The planar carrier, which can be employed for mounting on a rim of a steering wheel without wrinkles, comprises a portion of planar flexible foil of roughly rectangular shape having two longitudinal sides and two lateral sides. A length B of the lateral sides is 0.96 to 1.00 times the perimeter of the rim. A number of N cut-outs per unit length are provided on each of the longitudinal sides, wherein the cut-outs of one side are located in a staggered fashion relative to opposing cut-out portions on the opposite side. The determining of an optimum shape and size of the cut-outs is described. Further described is a heat carrier, a heating and/or sensing device and methods for their production.

Multizone HoD sensor systems having a plurality of distinct and independent sensing zones along the steering wheel, which are capable of distinguishing various ways of holding the vehicle steering wheel by the driver (one hand, two hands, angular position), or an advanced development.

For instance, European patent EP 1 292 485 B1 describes a steering wheel for a vehicle, which comprises a steering ring, a hub, and at least one spoke connecting the steering ring and the hub. On the steering ring, sensors are arranged in a distributed manner along the circumference of the steering ring, extending over the entire length of the steering ring. The sensors are subdivided into a plurality of segments arranged one behind another in the longitudinal direction of the steering ring. The spacing between two segments of a sensor from one another in the longitudinal direction of the steering ring is smaller than a finger width, wherein the segments of the sensors, in the longitudinal direction of the steering ring, are shorter than a finger width. By that, the thumb and the fingers of the hand can be reliably distinguished from each other and a high spatial resolution is achieved.

SUMMARY

It is an object of the invention to provide a reliable capacitive sensor and/or heating member that enables a multizone sensor design, shows high operational robustness and can be integrated in a vehicle steering wheel in a simplified manner.

In one aspect of the present invention, the object is achieved by a self-standing sandwich structure that includes at least one capacitive sensor member and/or at least one heater member for automotive vehicle application, wherein the self-standing sandwich structure comprises:

an upper protective layer having a top side and a bottom side, wherein the upper protective layer is attached, for manufacturing and storage purposes, with its top side to a bottom side of a carrier film member, and wherein at least the bottom side of the carrier film member is of sufficiently low surface energy for enabling separating the carrier film member (28) and the upper protective layer (10) in a non-destructive manner, a lower protective layer having a top side and a bottom side, a bottom adhesive layer having a top side and a bottom side, wherein the bottom adhesive layer is attached with its top side to the bottom side of the lower protective layer, and at least an upper electrically conductive layer having a top side and a bottom side that is arranged between the bottom side of the upper protective layer and the top side of the lower protective layer.

The term "self-standing", as used in this application, shall in particular be understood to apply to an object or a structure that is self-standing even if not support by another object or another structure.

The terms "upper" and "lower", as used in this application, shall be understood with reference to the carrier film member, wherein "upper" means closer to, and "lower" means further away from the carrier film member, which is meant to be positioned on top of the self-standing sandwich structure.

The terms "top side" and "bottom side", as used in this application, shall be understood such that a top side of a layer, at least in a state after manufacturing, is facing the carrier film member, and the bottom side of the layer, at least in a state after manufacturing, is facing away from the carrier film member.

The self-standing sandwich structure can be manufactured in an easy and cost-efficient manner. Further, the self-standing sandwich structure can be attached to stretchable materials and materials of high softness, such as a vehicle door panel, a leather trim, foam, a plastic support and many more, which allows a close-to-surface integration. The close-to-surface integration of the self-standing sandwich structure can facilitate an energy-efficient heating of a heater member and an improved sensitivity of a capacitive sensor member.

Another advantage of the disclosed self-standing sandwich structure is that it can facilitate a multizone functionality, which, for instance, in a suitable embodiment can allow the detection of a number of hands and their touching locations on a vehicle steering wheel.

Moreover, capacitive sensing and heating can be combined by the self-standing sandwich structure with low installation effort and in a cost-efficient manner. An integration stress for furnishing vehicle parts with capacitive sensor members and/or heater members can significantly be reduced, which can result in an improved reliability.

The carrier film member can be formed by, without being limited to, a film of pre-coated polyethylene terephthalate (PET), polyimide (PI), polytetrafluoroetylene (PTFE), polyethylene naphthalate (PEN), polypropylene (PP), polymethylmethacrylate (PMMA), paper, or any other carrier film of sufficiently low surface energy that appears appropriate to those skilled in the art.

The protective layers are meant to have virtually negligible electric conductivity and to serve for providing protection against mechanical wear.

The disclosed self-standing sandwich structure is employable for, but not limited to, providing at least one capacitive sensor member and/or at least one heater member in automotive vehicle applications such as vehicle seats, head rests, door panel heaters, arm rests and, in particular, vehicle steering wheels, for heating and/or for Hands on Detection (HoD).

The self-standing sandwich structure can, at least in parts, be manufactured by depositing the different layers, for instance, via screen printing or inkjet printing or by any other method that appears to be suitable to those skilled in the art, in the described sequence on the low energy surface of the carrier film member. Therefrom, the self-standing sandwich structure can be easily peeled off to obtain a self-standing, flexible and/or stretchable stack of thin layers with described sensing and/or heating functionality. After separating the self-standing sandwich structure and the carrier film member, the self-standing sandwich structure can be readily installed in an automotive vehicle part, in particular the steering wheel, either directly on its core or on an inside of a steering wheel trim.

The term "vehicle", as used in this application, shall particularly be understood to encompass passenger cars, trucks, semi-trailer tractors and buses.

Preferably, at least the upper electrically conductive layer either comprises electrically highly conductive material for generating low electric losses during operation or comprises electrically resistive material for generating electric heat during operation. An upper electrically conductive layer that comprises electrically highly conductive material can beneficially be used as a capacitive sensor member such as an antenna electrode of a capacitive sensor. The electrically highly conductive material ensures adequate response when exposed to a time-varying electric field.

An upper electrically conductive layer that comprises electrically highly conductive material can, for instance, be implemented by applying a screen printing or an inkjet printing method, using an electrically conductive ink that comprises silver, followed by a step of curing the ink.

An upper electrically conductive layer that comprises electrically resistive material can beneficially be used as a heater member and can, for instance, be implemented by applying a screen printing or an inkjet printing method, using an electrically conductive ink comprising a material that has an electrical resistivity with a positive temperature coefficient, followed by a step of curing the ink.

An application of high-precision manufacturing methods such as screen printing and inkjet printing can result in low tolerances of a thickness and, thus, electrical properties of the electrically conductive layer.

In preferred embodiments, the self-standing sandwich structure further includes a lower electrically conductive layer having a top side and a bottom side and comprising electrically resistive material for generating electric heat during operation. Herein, the lower electrically conductive layer is arranged between the bottom side of the upper protective layer and the top side of the lower protective layer. The upper electrically conductive layer comprises electrically highly conductive material for generating low electric losses during operation and the lower electrically conductive layer is attached with its top side to the bottom side of the upper electrically conductive layer.

In this configuration, the upper electrically conductive layer can beneficially serve as an electric bus bar for the lower electrically conductive layer, in this way providing an even current distribution and providing a larger design freedom for heater members.

In general, the functions of the upper electrically conductive layer and the lower electrically conductive layer may be interchanged; i.e. the upper electrically conductive layer may comprise electrically resistive material for generating electric heat during operation, and the lower electrically conductive layer may comprise electrically highly conductive material for generating low electric losses during operation.

In preferred embodiments, the self-standing sandwich structure further includes a lower electrically conductive layer, which has a top side and a bottom side and is arranged between the bottom side of the upper protective layer and the top side of the lower protective layer. At least the lower electrically conductive layer either comprises electrically highly conductive material for generating low electric losses during operation or comprises electrically resistive material for generating electric heat during operation. The self-standing sandwich structure further comprises a dielectric layer having a top side and a bottom side, wherein the dielectric layer is attached with its top side to the bottom side of the upper electrically conductive layer, and is attached with its bottom side to the top side of the lower electrically conductive layer.

A configuration in which both the upper electrically conductive layer and the lower electrically conductive layer comprise electrically highly conductive material can beneficially be employed as two distinct antenna electrodes of a capacitive sensor, wherein the two distinct antenna electrodes are electrically insulated and spaced apart from each other by the dielectric layer. The electrically highly conductive material ensures adequate response when exposed to a time-varying electric field.

A configuration in which one of the upper electrically conductive layer and the lower electrically conductive layer comprises electrically highly conductive material and the other electrically conductive layer comprises electrically resistive material for generating electric heat during operation can beneficially be employed as a combination of one capacitive sensor member serving as an antenna electrode of a capacitive sensor with a heater member.

In preferred embodiments of the self-standing sandwich structure, in which both the upper electrically conductive layer and the lower electrically conductive layer comprise electrically highly conductive material, the self-standing sandwich structure further includes a third electrically conductive layer having a top side and a bottom side and comprising electrically resistive material for generating electric heat during operation. Herein, the third electrically conductive layer is attached with its top side to the bottom side of the lower electrically conductive layer and is attached with its bottom side to the top side of the lower protective layer.

This configuration can beneficially be employed as a combination of one capacitive sensor member serving as an antenna electrode of a capacitive sensor with a heater member, wherein the lower electrically conductive layer can beneficially serve as an electrical bus bar for the third electrically conductive layer.

In preferred embodiments of the self-standing sandwich structure, in which the upper electrically conductive layer and the lower electrically conductive layer comprise electrically highly conductive material for generating low electric losses during operation, the self-standing sandwich structure further includes an intermediate protective layer having a top side and a bottom side that is attached with the top side to the bottom side of the lower electrically conductive layer. The self-standing sandwich structure further includes at least a third electrically conductive layer having a top side and a bottom side that is arranged between the bottom side of the intermediate protective layer and the top side of the lower protective layer and either comprises electrically highly conductive material for generating low electric losses during operation or electrically resistive material for generating electric heat during operation.

Preferably, the self-standing sandwich structure comprises a plurality of sandwiched layer units, wherein each sandwiched layer unit at least includes an upper protective layer, a lower protective layer, at least one electrically conductive layer having a top side and a bottom side that is arranged between the bottom side of the upper protective layer and the top side of the lower protective layer, and a bottom adhesive layer having a top side and a bottom side. The bottom adhesive layer is attached with its top side to the bottom side of the lower protective layer. The sandwiched layer units are arranged on top of each other and are attached with the top side of an uppermost protective layer to the bottom side of the carrier film member.

In this way, a self-standing sandwich structure can be provided that comprises one or more capacitive sensor members and/or one or more heater members in a compact configuration.

Preferably, sandwiched layer units of the same kind (i.e. capacitance sensor member or heater member) are identically designed for ease of manufacturing.

Preferably, the bottom adhesive layer comprises at least one of a pressure-sensitive adhesive and a heat-activated adhesive. In this way, the self-standing sandwich structure can readily be installed in an automotive vehicle part.

Preferably, the pressure-sensitive adhesive and the heat-activated adhesive are screen printable or inkjet printable so as to enable applying a screen printing or an inkjet printing method during manufacturing of the self-standing sandwich structure.

In another aspect of the invention, a vehicle steering wheel is provided that comprises at least one self-standing sandwich structure as disclosed herein. The at least one self-standing sandwich structure is fixedly attached with the bottom side of the bottom adhesive layer to a part of the vehicle steering wheel.

The benefits described in context with the self-standing sandwich structure proposed herein apply to the vehicle steering wheel to the full extent.

Preferably, the vehicle steering wheel comprises a plurality of self-standing sandwich structures as disclosed herein. The self-standing sandwich structures are attached to at least a steering ring of the vehicle steering wheel in a plurality of mutually distinct zones. In this way, a multizone capacitive HoD sensor system including heating facility can readily be implemented.

In yet another aspect of the invention, a method of applying at least one self-standing sandwich structure as disclosed herein to an automotive vehicle part, in particular to a vehicle steering wheel. The method comprises at least the following steps:

providing a self-standing sandwich structure as disclosed herein,
peeling off the carrier film member from the self-standing sandwich structure,
attaching the self-standing sandwich structure with the bottom side of the bottom adhesive layer to the automotive vehicle part, and
curing the adhesive layer by applying pressure or by heat treatment.

These and other aspects of the invention will be apparent from and elucidated with reference to the embodiments described hereinafter.

It shall be pointed out that the features and measures detailed individually in the preceding description can be combined with one another in any technically meaningful manner and show further embodiments of the invention. The description characterizes and specifies embodiments of the invention in particular in connection with the figures.

BRIEF DESCRIPTION OF THE DRAWINGS

Further details and advantages of the present invention will be apparent from the following detailed description of not limiting embodiments with reference to the attached drawing, wherein.

DETAILED DESCRIPTION

In the different figures, same parts are always provided with the same reference numeral, and are thus usually described only once.

Figure 1:
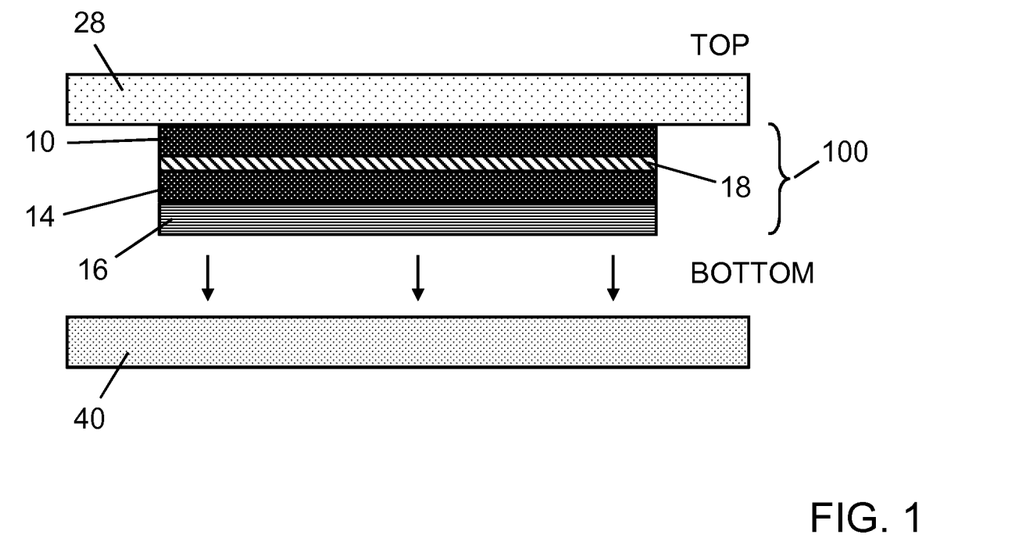
FIG. 1 schematically illustrates a possible embodiment of a self-standing sandwich structure in accordance with the invention in a side sectional view, FIGS. 2 to 6 schematically illustrate alternative possible embodiments of a self-standing sandwich structure in accordance with the invention in the same view as FIG. 1, and FIG. 7 schematically shows a vehicle steering wheel furnished with self-standing sandwich structures.

FIG. 1 schematically illustrates a possible embodiment of a self-standing sandwich structure 100 in accordance with the invention in a side sectional view. The self-standing sandwich structure 100 includes a capacitive sensor member for automotive vehicle application.

The self-standing sandwich structure 100 includes an upper protective layer 10 that is made from a screen printable dielectric material and that has a top side and a bottom side. In alternative embodiments, the upper protective layer may be made from cured synthetic resin. The upper protective layer 10 is attached, for manufacturing and storage purposes, by applying a screen printing process with its top side to a bottom side of a carrier film member 28, which is made, for instance, from polyimide (PI). The bottom side of the carrier film member 28 is of sufficiently low surface energy such that the material of the upper protective layer 10 does not "wet" the carrier film member 28; i.e. only a weak bond is created between the carrier film member 28 and the upper protective layer 10. Thus, it is enabled that the carrier film member 28 and the upper protective layer 10 can be separated in a non-destructive manner prior to attaching the self-standing sandwich structure 100 to an automotive vehicle part 40.

The self-standing sandwich structure 100 further comprises a lower protective layer 14 that has a top side and a bottom side. The lower protective layer 14 is made from the same screen printable dielectric material as the upper protective layer 10. Then, the self-standing sandwich structure 100 includes an upper electrically conductive layer 18 that has a top side and a bottom side and that is arranged between the bottom side of the upper protective layer 10 and the top side of the lower protective layer 14. The upper electrically conductive layer 18 comprises electrically highly conductive material and is implemented by applying a screen printing method and using an electrically conductive ink comprising silver. In the automotive vehicle application, the upper electrically conductive layer 18 serves as a capacitive sensor member that is used as an antenna electrode of a capacitive sensor. The electrically highly conductive material ensures generating low electric losses and, thus, adequate response of the antenna electrode to time-varying electric fields employed during operation of the capacitive sensor.

Further, the self-standing sandwich structure 100 comprises a bottom adhesive layer 16 that has a top side and bottom side and is made from a screen printable ink comprising pressure-sensitive adhesive. In alternative embodiments, the bottom adhesive layer may comprise a heat-activated adhesive. The bottom adhesive layer 16 is attached with its top side to the bottom side of the lower protective layer 14.

In an automotive vehicle application, the self-standing sandwich structure 100 can be attached to a vehicle part 40 after peeling off, for instance by hand, the carrier film member 28 from the self-standing sandwich structure 100. The self-standing sandwich structure 100 is then attached with the bottom side of the bottom adhesive layer 16 to the vehicle part 40 and is fixated by curing the pressure-sensitive adhesive of the bottom adhesive layer 16 by applying pressure to the bottom adhesive layer 16, for instance by hand. The vehicle part 40 may be formed by a steering wheel and may in general have a surface comprising leather, foam, plastic material, wood and many more. For the case of an alternative self-standing sandwich structure including an adhesive layer that comprises a heat-activated adhesive, the self-standing sandwich structure is fixated to the vehicle part by applying a heat treatment.

In FIGS. 2 to 6, alternative possible embodiments of a self-standing sandwich structure in accordance with the invention are schematically illustrated in the same view as in FIG. 1. In order to avoid unnecessary repetition, only differences between the various embodiments will be described in the following.

Figure 2:
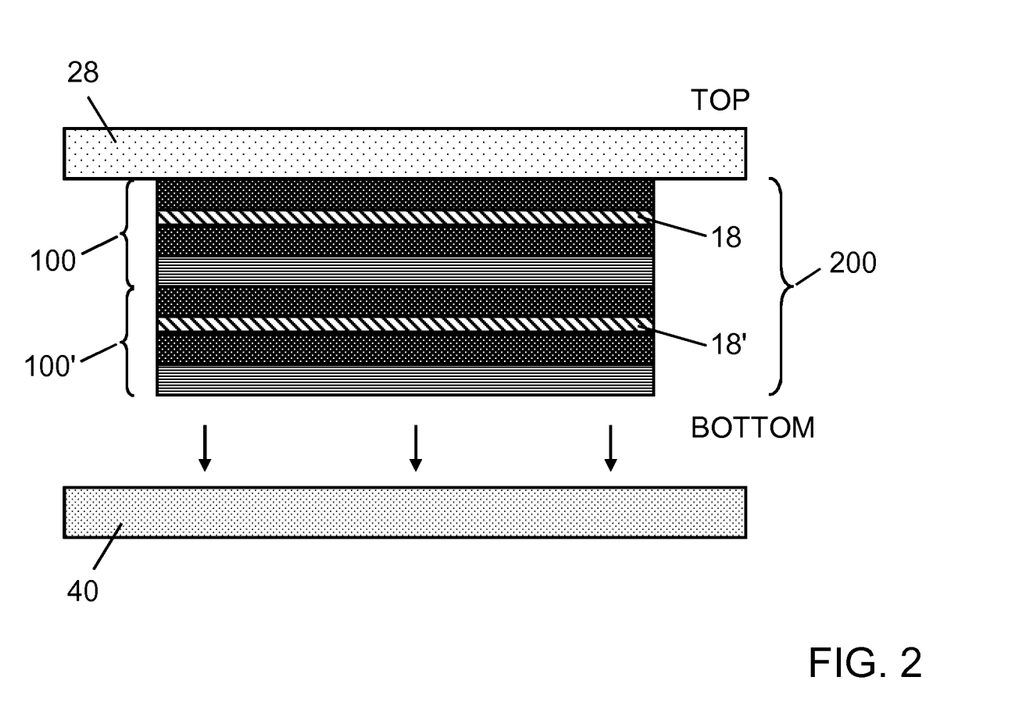

FIG. 2 schematically shows another possible embodiment of a self-standing sandwich structure 200 in accordance with the invention. The upper protective layer 10, the upper electrically conductive layer 18, the lower protective layer 14 and the bottom adhesive layer 16 of the self-standing sandwich structure 100 pursuant to FIG. 1 can be considered to form one sandwiched layer unit. In this sense, the self-standing sandwich structure 200 pursuant to FIG. 2 comprises a plurality of two sandwich layer units that are identically formed to the sandwich layer unit of the self-standing sandwich structure 100 pursuant to FIG. 1. The two sandwich layer units of the self-standing sandwich structure 200 pursuant to FIG. 2 are arranged on top of each other and are attached with the top side of the uppermost protective layer 10 to the bottom side of the carrier film member 28. In this way, the self-standing sandwich structure 200 comprises two distinct upper electrically conductive layers 18, 18', which in an automotive vehicle application can serve as capacitive sensor members that are usable as two separate antenna electrodes of a capacitive sensor.

Figure 3:
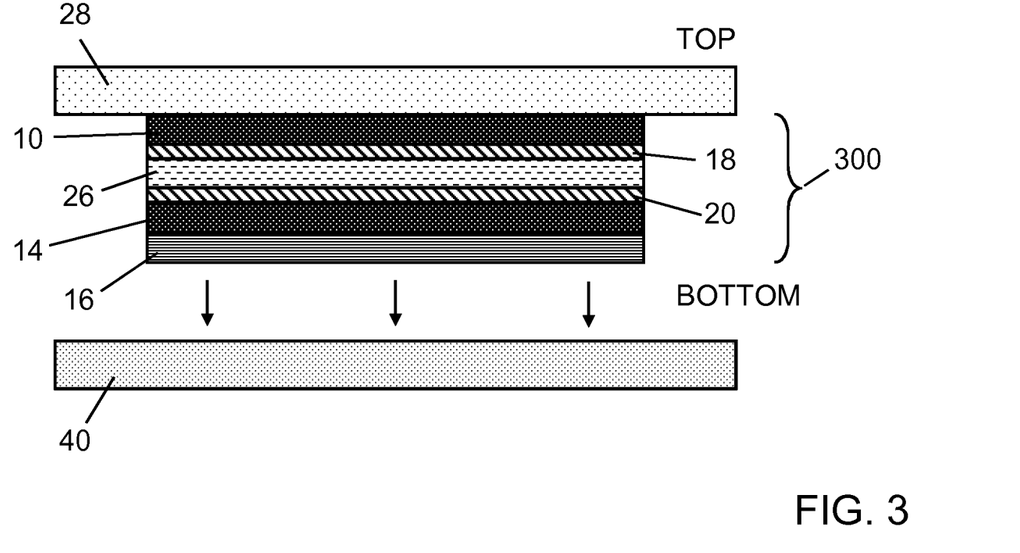

FIG. 3 schematically shows another possible embodiment of a self-standing sandwich structure 300 in accordance with the invention. Compared to the embodiment of the self-standing sandwich structure 100 pursuant to FIG. 1, the self-standing sandwich structure shown 300 in FIG. 3 further comprises a lower electrically conductive layer 20, which has a top side and a bottom side and is arranged between the bottom side of the upper protective layer 10 and the top side of the lower protective layer 14. Both the lower electrically conductive layer 20 and the upper electrically conductive layer 18 comprise electrically highly conductive material for generating low electric losses during operation. The self-standing sandwich structure 300 further includes a dielectric layer 26 having a top side and a bottom side. The dielectric layer 26 is attached with its top side to the bottom side of the upper electrically conductive layer 18, and is attached with its bottom side to the top side of the lower electrically conductive layer 20. In this way, the self-standing sandwich structure 300 comprises two distinct electrically conductive layers 18, 20, which in an automotive vehicle application can serve as capacitive sensor members that are used as two separate antenna electrodes of a capacitive sensor.

Figure 4:
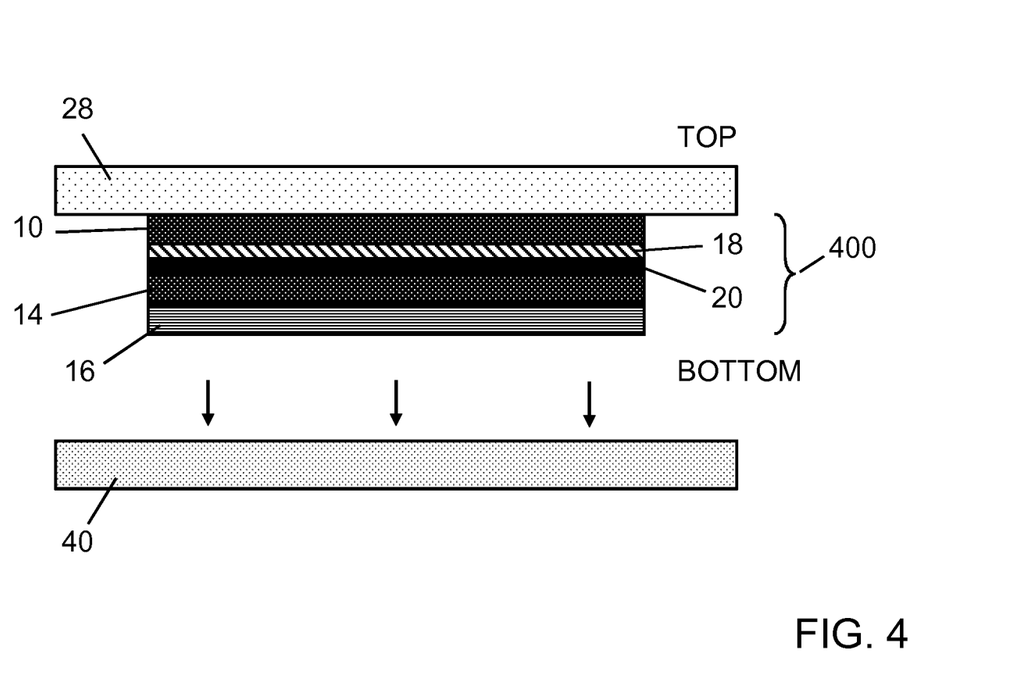

FIG. 4 schematically shows another possible embodiment of a self-standing sandwich structure 400 in accordance with the invention, which includes a heater member for automotive vehicle application. Compared to the embodiment of the self-standing sandwich structure 100 pursuant to FIG. 1, the self-standing sandwich structure 400 shown in FIG. 4 further comprises a lower electrically conductive layer 20 having a top side and a bottom side and comprising electrically resistive material for generating electric heat during operation. The lower electrically conductive layer 20 may for instance be implemented by applying a screen printing or an inkjet printing method using an electrically conductive ink that comprises a material that has an electrical resistivity with a positive temperature coefficient, followed by a step of curing the ink. Suitable screen printable electrically conductive inks are commercially readily available.

The lower electrically conductive layer 20 is arranged between the bottom side of the upper protective layer 10 and the top side of the lower protective layer 14. The lower electrically conductive layer 20 is attached with its top side to the bottom side of the upper electrically conductive layer 18 and is attached with its bottom side to the top side of the lower protective layer 14.

The upper electrically conductive layer 18 can serve as an electric bus bar for the lower electrically conductive layer 20, which is usable as a heater member for an automotive vehicle application, for instance for heating a vehicle steering wheel.

Figure 5:
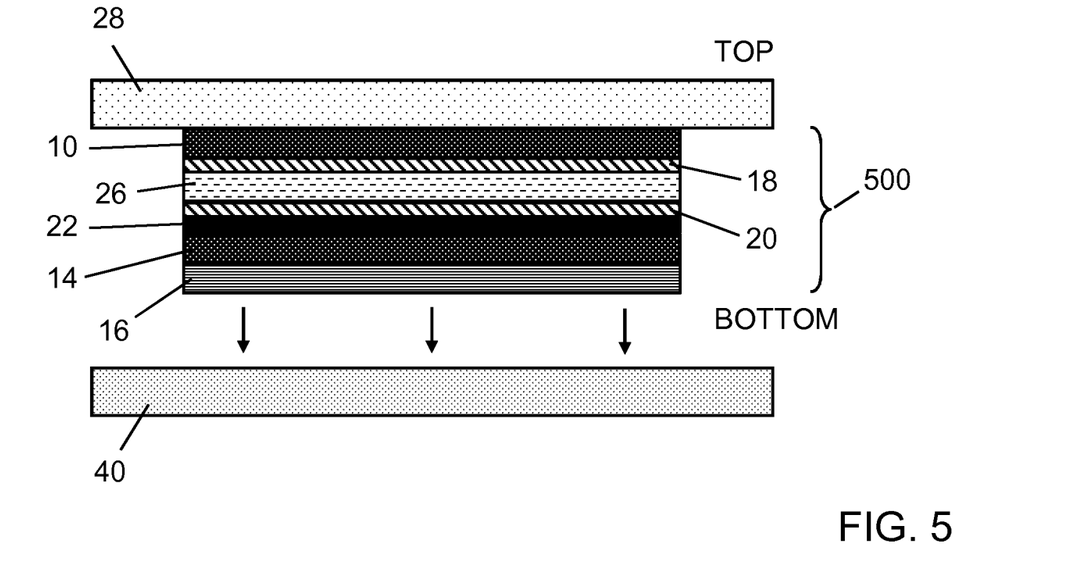

FIG. 5 schematically shows another possible embodiment of a self-standing sandwich structure 500 in accordance with the invention, which includes a combination of a capacitive sensor member and a heater member for automotive vehicle application, for instance for a Hands on Detection (HoD) system on a heatable vehicle steering wheel.

Compared to the embodiment of a self-standing sandwich structure 300 shown in FIG. 3, the self-standing sandwich structure 500 pursuant to FIG. 5 further includes a third electrically conductive layer 22 having a top side and a bottom side. The third electrically conductive layer 22 comprises electrically resistive material for generating electric heat during operation. The third electrically conductive layer 22 is attached with its top side to the bottom side of the lower electrically conductive layer 20 and is attached with its bottom side to the top side of the lower protective layer 14.

In this configuration, the upper electrically conductive layer 18 serves, in an automotive vehicle application, as a capacitive sensor member that is used as an antenna electrode of a capacitive sensor. The lower electrically conductive layer 20 serves as an electric bus bar for the third electrically conductive layer 22, which can be used as a heater member for the automotive vehicle application, for instance for heating a vehicle steering wheel.

Figure 6:
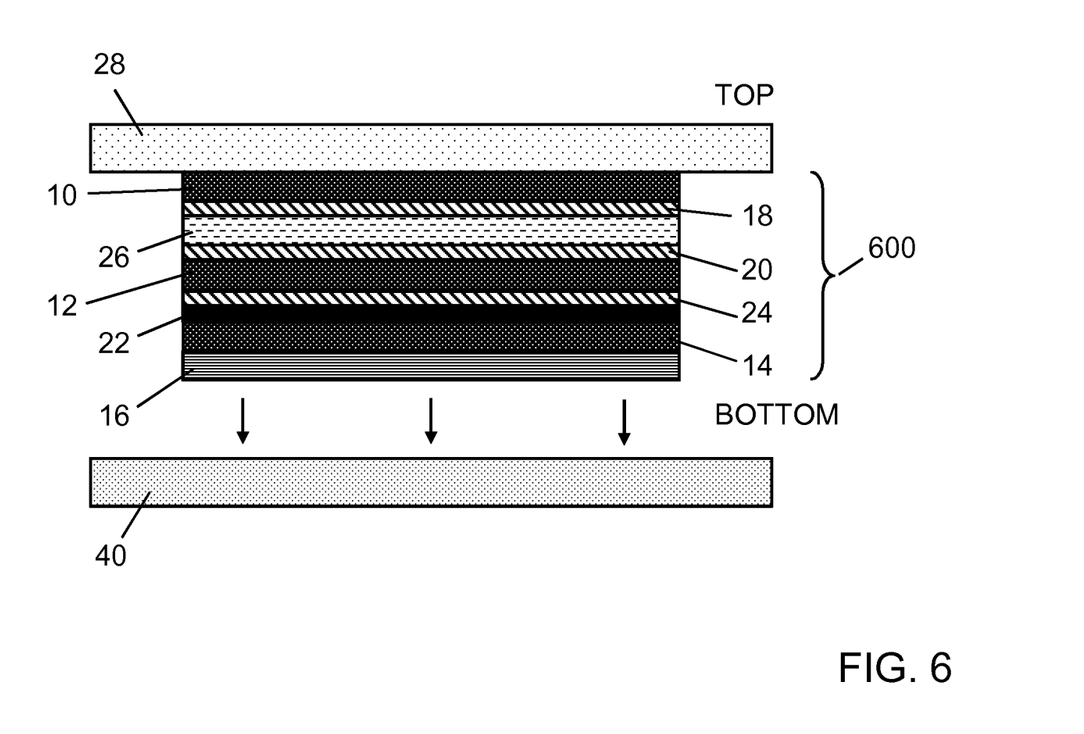

FIG. 6 schematically shows another possible embodiment of a self-standing sandwich structure 600 in accordance with the invention, which includes a combination of two capacitive sensor members and a heater member for automotive vehicle application, for instance for a Hands on Detection (HoD) system of a heatable vehicle steering wheel.

Compared to the embodiment of a self-standing sandwich structure 300 shown in FIG. 3, the self-standing sandwich structure 600 pursuant FIG. 6 further includes an intermediate protective layer 12 having a top side and a bottom side. The intermediate protective layer 12 is attached with the top side to the bottom side of the lower electrically conductive layer 20. The self-standing sandwich structure 600 further includes, arranged between the bottom side of the intermediate protective layer 12 and the top side of the lower protective layer 14, a third electrically conductive layer 22 having a top side and a bottom side and a fourth electrically conductive layer 24 having a top side and a bottom side. The third electrically conductive layer 22 comprises electrically resistive material for generating electric heat during operation. The fourth electrically conductive layer 24 comprises electrically highly conductive material for generating low electric losses during operation. The fourth electrically conductive layer 24 is attached with its top side to the bottom side of the intermediate protective layer 12 and is attached with its bottom side to the top side of the third electrically conductive layer 22. The third electrically conductive layer 22 is attached with its bottom side to the top side of the lower protective layer 14.

In alternative embodiments, positions of the third electrically conductive layer 22 and the fourth electrically conductive layer 24 may be interchanged.

Figure 7:
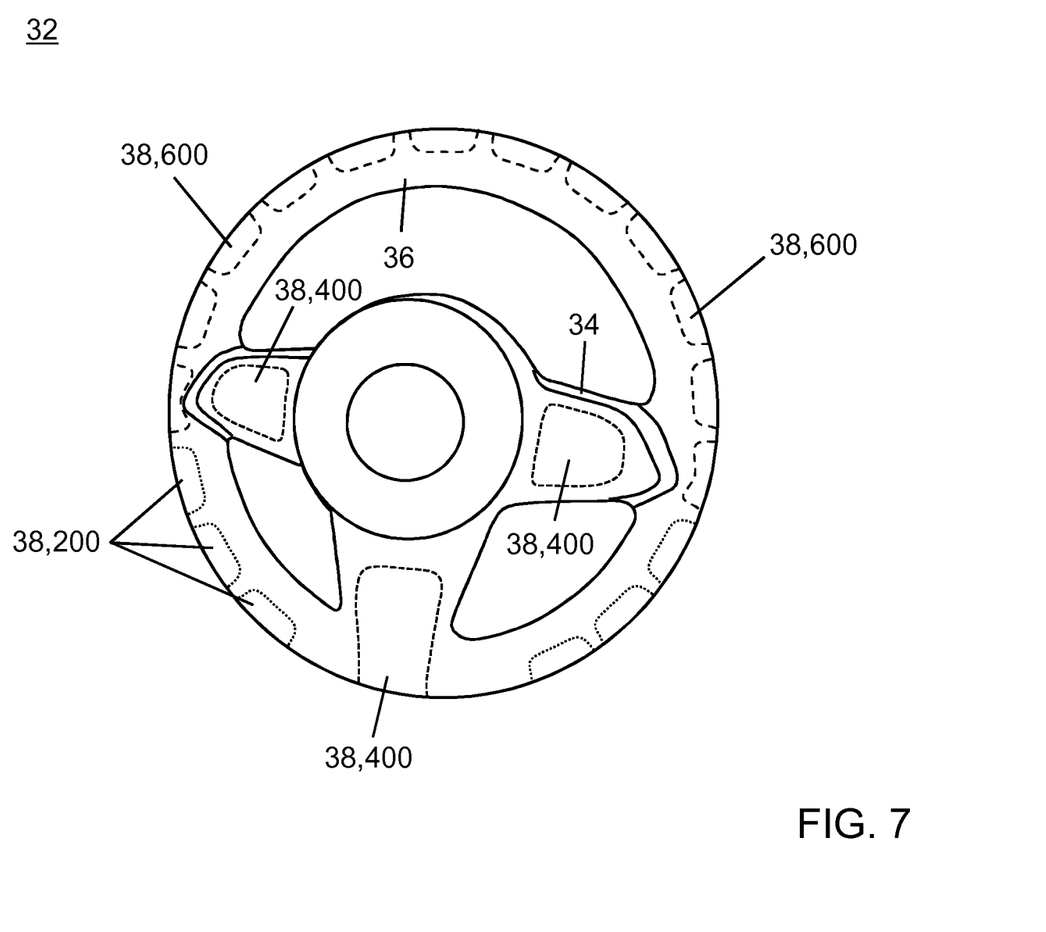

FIG. 7 schematically shows a steering wheel 32 of a vehicle that is formed as a passenger car. The vehicle steering wheel 32 comprises three spokes 34 connected to a steering ring 36. The vehicle steering wheel 32 further includes a plurality of identical embodiments of the self-standing sandwich structure 300, 400, 600 as disclosed herein for sole capacitive sensing (self-standing sandwich structures 300), sole heating on demand (self-standing sandwich structures 400) and combined capacitive sensing and heating on demand (self-standing sandwich structures 600). The self-standing sandwich structures 300, 400, 600 are attached to the steering wheel 32 all along the steering ring 36 and to the spokes 34 in a plurality of mutually distinct zones 38, wherein each one of the plurality of self-standing sandwich structures 300, 400, 600 is fixedly attached with the bottom side of its bottom adhesive layer 16 to the steering ring 36 and the spokes 34 of the vehicle steering wheel, respectively. In FIG. 7, the type of self-standing sandwich structure 300, 400, 600 that is installed in each zone is indicated by differently dashed lines. The plurality of self-standing sandwich structures 300, 400, 600 is configured to provide heat to the vehicle steering wheel 32 on demand and, further, form part of a multizone capacitive vehicle Hands on Detection (HoD) system.

While the invention has been illustrated and described in detail in the drawings and foregoing description, such illustration and description are to be considered illustrative or exemplary and not restrictive; the invention is not limited to the disclosed embodiments.

Other variations to be disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality, which is meant to express a quantity of at least two. The mere fact that certain measures are recited in mutually different dependent claims does not indicate that a combination of these measures cannot be used to advantage. Any reference signs in the claims should not be construed as limiting scope.

The invention claimed is:

1. A self-standing sandwich structure, including at least one capacitive sensor member, at least one heater member, or both, for an automotive vehicle application, the self-standing sandwich structure comprising:
    an upper protective layer having a top side and a bottom side, wherein the upper protective layer is attached, with its top side to a bottom side of a carrier film member, and wherein at least the bottom side of the carrier film member is of sufficiently low surface energy for enabling separating the carrier film member and the upper protective layer in a non-destructive manner,
    a lower protective layer having a top side and a bottom side,
    a bottom adhesive layer having a top side and a bottom side, wherein the bottom adhesive layer is attached with its top side to the bottom side of the lower protective layer, and
    at least an upper electrically conductive layer having a top side and a bottom side that is arranged between the bottom side of the upper protective layer and the top side of the lower protective layer,
    a lower electrically conductive layer having a top side and a bottom side and comprising electrically resistive material for generating electric heat during operation and being arranged between the bottom side of the upper protective layer and the top side of the lower protective layer, wherein the upper electrically conductive layer comprises electrically highly conductive material for generating low electric losses during operation and the lower electrically conductive layer is attached with its top side to the bottom side of the upper electrically conductive layer.

2. The self-standing sandwich structure as claimed in claim 1, comprising a plurality of sandwiched layer units, each sandwiched layer unit at least including the upper protective layer, the lower protective layer, at least one electrically conductive layer having a top side and a bottom side that is arranged between the bottom side of the upper protective layer and the top side of the lower protective layer, and the bottom adhesive layer having a top side and a bottom side, wherein the bottom adhesive layer is attached with its top side to the bottom side of the lower protective layer, and wherein the sandwiched layer units are arranged on top of each other and are attached with the top side of an uppermost protective layer to the bottom side of the carrier film member.

3. The self-standing sandwich structure as claimed in claim 1, wherein the bottom adhesive layer comprises at least one of a pressure-sensitive adhesive and a heat-activated adhesive.

4. A vehicle steering wheel comprising at least one self-standing sandwich structure as claimed in claim 1, wherein the at least one self-standing sandwich structure is fixedly attached with the bottom side of the bottom adhesive layer to a part of a vehicle steering wheel.

5. The vehicle steering wheel as claimed in claim 4, comprising a plurality of the self-standing sandwich structures, wherein the self-standing sandwich structures are attached to at least a steering ring of the vehicle steering wheel in a plurality of mutually distinct zones.

6. A method of applying at least one self-standing sandwich structure to a vehicle steering wheel, the method comprising at least the following steps:
    providing a self-standing sandwich structure as claimed in claim 1,
    peeling off the carrier film member from the self-standing sandwich structure,
    attaching the self-standing sandwich structure with the bottom side of the bottom adhesive layer to the vehicle steering wheel, and
    curing the adhesive layer by applying pressure or by heat treatment.

7. A self-standing sandwich structure, including at least one capacitive sensor member, at least one heater member, or both, for an automotive vehicle application, the self-standing sandwich structure comprising:
- an upper protective layer having a top side and a bottom side, wherein the upper protective layer is attached, with its top side to a bottom side of a carrier film member, and wherein at least the bottom side of the carrier film member is of sufficiently low surface energy for enabling separating the carrier film member and the upper protective layer in a non-destructive manner,
- a lower protective layer having a top side and a bottom side,
- a bottom adhesive layer having a top side and a bottom side, wherein the bottom adhesive layer is attached with its top side to the bottom side of the lower protective layer, and
- at least an upper electrically conductive layer having a top side and a bottom side that is arranged between the bottom side of the upper protective layer and the top side of the lower protective layer,
- a lower electrically conductive layer, which has a top side and a bottom side and is arranged between the bottom side of the upper protective layer and the top side of the lower protective layer, wherein at least the lower electrically conductive layer either comprises electrically highly conductive material for generating low electric losses during operation or comprises electrically resistive material for generating electric heat during operation, and further including a dielectric layer having a top side and a bottom side, wherein the dielectric layer is attached with its top side to the bottom side of the upper electrically conductive layer, and is attached with its bottom side to the top side of the lower electrically conductive layer.

8. The self-standing sandwich structure as claimed in claim 7, with the lower electrically conductive layer comprising electrically highly conductive material for generating low electric losses during operation, and further including a third electrically conductive layer having a top side and a bottom side and comprising electrically resistive material for generating electric heat during operation, wherein the third electrically conductive layer is attached with its top side to the bottom side of the lower electrically conductive layer and is attached with its bottom side to the top side of the lower protective layer.

9. The self-standing sandwich structure as claimed in claim 7, with the upper electrically conductive layer and the lower electrically conductive layer comprising electrically highly conductive material for generating low electric losses during operation, and further including an intermediate protective layer having a top side and a bottom side and being attached with the top side to the bottom side of the lower electrically conductive layer, and further comprising, arranged between the bottom side of the intermediate protective layer and the top side of the lower protective layer, at least a third electrically conductive layer either comprising electrically highly conductive material for generating low electric losses during operation or comprising electrically resistive material for generating electric heat during operation.

10. The self-standing sandwich structure as claimed in claim 7, comprising a plurality of sandwiched layer units, each sandwiched layer unit at least including the upper protective layer, the lower protective layer, at least one electrically conductive layer having a top side and a bottom side that is arranged between the bottom side of the upper protective layer and the top side of the lower protective layer, and the bottom adhesive layer having a top side and a bottom side, wherein the bottom adhesive layer is attached with its top side to the bottom side of the lower protective layer, and wherein the sandwiched layer units are arranged on top of each other and are attached with the top side of an uppermost protective layer to the bottom side of the carrier film member.

11. The self-standing sandwich structure as claimed in claim 7, wherein the bottom adhesive layer comprises at least one of a pressure-sensitive adhesive and a heat-activated adhesive.

12. A vehicle steering wheel comprising at least one self-standing sandwich structure as claimed in claim 7, wherein the at least one self-standing sandwich structure is fixedly attached with the bottom side of the bottom adhesive layer to a part of a vehicle steering wheel.

13. The vehicle steering wheel as claimed in claim 12, comprising a plurality of the self-standing sandwich structures, wherein the self-standing sandwich structures are attached to at least a steering ring of the vehicle steering wheel in a plurality of mutually distinct zones.

14. A method of applying at least one self-standing sandwich structure to a vehicle steering wheel, the method comprising at least the following steps:
- providing a self-standing sandwich structure as claimed in claim 7,
- peeling off the carrier film member from the self-standing sandwich structure,
- attaching the self-standing sandwich structure with the bottom side of the bottom adhesive layer to the vehicle steering wheel, and
- curing the adhesive layer by applying pressure or by heat treatment.

* * * * *